(12) United States Patent
Zhao

(10) Patent No.: US 8,575,019 B2
(45) Date of Patent: Nov. 5, 2013

(54) METAL INTERCONNECTION STRUCTURE AND METHOD FOR FORMING METAL INTERLAYER VIA AND METAL INTERCONNECTION LINE

(75) Inventor: Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 233 days.

(21) Appl. No.: 13/143,507

(22) PCT Filed: Feb. 17, 2011

(86) PCT No.: PCT/CN2011/071053

§ 371 (c)(1),
(2), (4) Date: Jul. 6, 2011

(87) PCT Pub. No.: WO2012/041033

PCT Pub. Date: Apr. 5, 2012

(65) Prior Publication Data

US 2012/0080792 A1    Apr. 5, 2012

(30) Foreign Application Priority Data

Sep. 30, 2010    (CN) .......................... 2010 1 0501703

(51) Int. Cl.
    *H01L 23/535*    (2006.01)
(52) U.S. Cl.
    USPC ........................... 438/618; 438/637; 438/639
(58) Field of Classification Search
    USPC ............ 438/6, 128, 618, 598, 629, 637, 639,
        438/640, 667, 668, 672, 675, 700, 701, 713,
        438/978; 257/774, E23.161, E23.011,
        257/E23.067, E23.145, E23.174, E21.577,
        257/E21.585, E21.578, E21.586
    See application file for complete search history.

(56) References Cited

U.S. PATENT DOCUMENTS

| 5,316,974 A * | 5/1994 | Crank ........................... 438/643 |
| 2003/0073257 A1* | 4/2003 | Watanabe ....................... 438/14 |

(Continued)

FOREIGN PATENT DOCUMENTS

| CN | 101136367 A | 8/2006 |
| CN | 101414576 A | 10/2007 |
| CN | 101447501 A | 6/2009 |

OTHER PUBLICATIONS

International Search Report and Written Opinion of the Chinese Patent Cooperation Treaty Office in counterpart foreign Application No. PCT/CN2011/071053, dated Sep. 30, 2010.

*Primary Examiner* — Cuong Q Nguyen
*Assistant Examiner* — Yosef Gebreyesus
(74) *Attorney, Agent, or Firm* — Kinney & Lange, P.A.

(57) ABSTRACT

There is provided a method for forming a metal interlayer via, comprising: forming a seed layer on a first dielectric layer and a first metal layer embedded in the first dielectric layer; forming a mask pattern on the seed layer to expose a portion of the seed layer covering some of the first metal layer; growing a second metal layer on the exposed portion of the seed layer; removing the mask pattern and a portion of the seed layer carrying the mask pattern to expose side walls of the second metal layer, a portion of the first metal layer and the first dielectric layer; forming an insulating barrier layer on the side walls, the portion of the first metal layer and the first dielectric layer. There is also provided a method for forming a metal interconnection line. Both of them can suppress the occurrence of voids. There is further provided a metal interconnection structure comprising a contact plug, a via and a metal interconnection line, wherein the via is formed on the metal interconnection line, the metal gate and/or the contact plug.

23 Claims, 6 Drawing Sheets

(56) References Cited

U.S. PATENT DOCUMENTS

| | | | |
|---|---|---|---|
| 2004/0005773 A1* | 1/2004 | Lopatin et al. | 438/622 |
| 2004/0121621 A1* | 6/2004 | Ruelke et al. | 438/786 |
| 2006/0019487 A1* | 1/2006 | Leuschner et al. | 438/637 |
| 2006/0276029 A1* | 12/2006 | Usami et al. | 438/629 |
| 2007/0170594 A1* | 7/2007 | Matsumura et al. | 257/774 |
| 2008/0157357 A1* | 7/2008 | Kim et al. | 257/737 |

* cited by examiner

METAL INTERCONNECTION STRUCTURE AND METHOD FOR FORMING METAL INTERLAYER VIA AND METAL INTERCONNECTION LINE

CROSS-REFERENCE TO RELATED APPLICATION(S)

This application is a Section 371 National Stage Application of International Application No. PCT/CN2011/071053, filed on Feb. 17, 2011, which claims priority to Chinese Application No. CN 201010501703.4, filed on Sep. 30, 2010, the entire contents of which are incorporated herein by reference in their entirety.

FIELD OF INVENTION

The present invention relates to the semiconductor field, and more particularly, to a metal interconnection structure and methods for forming a metal interlayer via and a metal interconnection line.

BACKGROUND

In practice, a metal interconnection structure is usually formed by Damascene process in the semiconductor industry, including forming a metal interconnection line on a contact plug, forming an interlayer via on the metal interconnection line and then forming an upper-layer metal interconnection line on the interlayer via. The processes of making the via and lines can be repeated several times to achieve an interconnection of multiple metal layers.

The first metal interconnection line (M1) is implemented by Single Damascene process. Specifically, first, as shown in FIG. 1, on a first dielectric layer 20 and a first metal layer 10 (generally referred to as a contact plug) embedded in the first dielectric layer 20, a first barrier layer 30 and a second dielectric layer 40 are formed (in practice, a barrier layer 12 is sandwiched between the first dielectric layer 20 and the first metal layer 10, which is indicated in the drawings but is not presented in the explanations here for brief). Next, as shown in FIG. 2, the second dielectric layer 40 and the first barrier layer 30 are patterned to form a first trench 50. Subsequently, as shown in FIG. 3, a second barrier layer 32 is formed to cover the second dielectric layer 40 and the bottom and side walls of the first trench 50. Finally, a second metal layer is formed on the second barrier layer 32 to fill the first trench 50.

Currently, the second metal layer is copper. The copper layer may be formed on the second barrier layer 32 as follows. First, as shown in FIG. 4, a first copper layer 42 is formed on the second barrier layer 32. Then, as shown in FIG. 5, a second copper layer 44 is formed on the first copper layer 42 by electrical plating using the first copper layer 42 as plating seed. Finally, as shown in FIG. 6, the second copper layer 44, the first copper layer 42, and the second barrier layer 32 are planarized (by means of chemical mechanical polishing, for example) to expose the second dielectric layer 40.

Further, in the process where copper is used as the filling material for the contact plug, the contact plug may be achieved by means of steps similar to those of the above Single Damascene process. In this case, the first metal layer 10 becomes a metal silicide or a metal gate, and a contact hole is formed by patterning the second dielectric layer 40 and the first barrier layer 30. The remaining metallization steps are kept unchanged.

From the second metal interconnection line (M2), Dual Damascene process is usually adopted in the industrial manufacture to form a metal interconnection line and an underlying via connected thereto at one time. The via is further connected to a lower-layer metal interconnection line. The Dual Damascene process distinguishes from the Single Damascene process in that it adopts two layers of etching resist, two times of exposure and two times of etching so as to form a trench for embedding the metal interconnection line and a through hole in two dielectric layers at one time. The subsequent metallization steps are similar to those of the above described Single Damascene process.

Nowadays, with the continuously decreasing of the device size, interconnection features, including the contact hole, the first trench 50, further trenches (such as the second trench) and the through hole, have a continuously increasing depth-to-width ratio. As a result, it is more and more difficult to fill the features to form a metal interconnection structure satisfying the process requirements. A common problem is that in filling the features with copper to form the interconnects (contact plug, the interlayer via and the metal interconnection lines), voids may be generated in the interconnects, which tend to cause failure of devices.

Generally, taking the case where Single Damascene process is adopted to form a metal interconnection line as an example, one of the reasons why voids may be formed in the metal interconnection line is considered as that: the second barrier layer 32 and the first copper layer 42 (i.e. the seed layer) are formed by means of sputtering to cover the bottom and side walls of the trench and the second dielectric layer 40 in which the trench is embedded, that is, to cover a sharp corner 52 located at the opening of the trench, and portions of the second barrier layer 32 and the first copper layer 42 covering the corner 52 have a thickness greater than portions of the second barrier layer 32 and the first copper layer 42 covering the bottom and side walls and the second dielectric layer 40 in which the trench is embedded. Since the opening of the trench is becoming smaller and smaller in size, the filling of the metal layer at the opening tends to be finished first, resulting in a neck blocking effect, due to which, the further filling of the metal layer into the trench is prevented so that voids are formed in the trench.

Furthermore, with the continuously increasing of the depth-to-width ratio of the trench, it is more and more difficult for the second barrier layer 32 and the first copper layer 42 to be attached to the side walls of the trench. Thus, it is impossible to form a continuous seed layer necessary for the plating. In other words, it is more and more difficult for the second barrier layer 32 and the first copper layer 42 to cover the bottom and side walls of the trench and the second dielectric layer 40 having the trench embedded therein, so that it is impossible to carry out plating of the copper in the lower portion of the trench, resulting in voids or even disconnections.

The above difficulties also occur in the process of forming copper contact plugs and the process of forming metal lines and vias by means of Dual Damascene process. To suppress the occurrence of the voids, those skilled in the art have already made a number of attempts. A basic idea is to reduce the depth-to-width ratio of the contact hole. One way to achieve this is to reduce the thickness of the second barrier layer 32. However, the thickness of the second barrier layer 32 (TaN/Ta, for example) cannot be reduced without limit because the second barrier layer 32 will lose its function if its thickness is reduced to some extent (for example, as to the 22 nm process, the thickness of the second barrier layer 32 generally cannot be less than 6 nm).

Therefore, there is a need for a novel method for forming metal interconnections to suppress the occurrence of voids, which may cause disconnection in a worse case.

SUMMARY OF THE INVENTION

To solve the above problems, the present invention provides methods for forming metal interlayer via and metal interconnection lines, by which it is possible to significantly suppress or even fully avoid the occurrence of voids. Further, the present invention also provides a metal interconnection structure which has a difference from the state-of-art one in the arrangement of barrier layers surrounding the lines and via.

According to the present invention, there is provided a method for forming a metal interlayer via, comprising: forming a seed layer on a first dielectric layer and a first metal layer embedded in the first dielectric layer; forming a mask pattern on the seed layer to expose a portion of the seed layer which covers a portion of the first metal layer; growing a second metal layer by plating using the exposed seed layer; removing the mask pattern and a portion of the seed layer carrying the mask pattern to expose the side walls of the second metal layer, a portion of the first metal layer and the first dielectric layer; forming an insulating barrier layer on said side walls, said portion of the first metal layer and said first dielectric layer.

According to the present invention, there is further provided a method for forming a metal interconnection line, comprising: forming a conductive barrier layer and a seed layer on a first dielectric layer and a first metal layer embedded in the first dielectric layer; forming a mask pattern on the seed layer to expose a portion of the seed layer which covers at least the first metal layer; growing a second metal layer by plating using the exposed portion of the seed layer; removing the mask pattern and also a portion of the conductive barrier layer and a portion of the seed layer carrying the mask pattern to expose the side walls of the second metal layer and the first dielectric layer; forming a barrier layer only on the side walls, or alternatively forming an insulating barrier layer on the side walls and on the first dielectric layer.

According to the present invention, there is further provided a metal interconnection structure abutting against a metal gate and a contact region of a device, comprising a contact plug, a via and a metal interconnection line, wherein the contact plug abuts against the contact region via a diffusion barrier layer, and the via is formed on the metal interconnection line, the metal gate and/or the contact plug. The sidewalls and the top surface of the lines are covered by an insulating diffusion barrier and the bottom of the lines is protected by a conductive diffusion barrier. The sidewalls of the via are covered by an insulating diffusion barrier as well. There is a conductive diffusion barrier layer between the upper copper line and the underlying interlayer via. No barrier layer exists between the interlayer via and the underlying line.

The present invention provides the following advantages over the prior art.

The seed layer is formed on the first dielectric layer and the first metal layer before the second metal layer is formed, so that the mask pattern is formed on the seed layer. As a result, in forming the second metal layer by plating using the mask pattern as a plating mold, the second metal layer is formed from the bottom upward on the portion of in the mold using the seed layer exposed on bottom of the mold. Unlike the prior art, the seed layer no longer covers any corner of the exposed region. Thus, it is possible to reduce the possibility that the neck blocking effect occurs at the corner and the possibility that voids occur in forming the second metal layer in the exposed region. Further, since the seed layer is formed on the first dielectric layer and the first metal layer, that is, the seed layer is formed on the surface defined by the first dielectric layer and the first metal layer, the second metal layer is grown from the bottom upward in the mold in the plating process, and there is no need for the seed layer on the side walls. Thus, it is possible to reduce the difficulty in filling the second metal layer due to the poor coverage of the seed layer on the side walls and the neck blocking effect as described above.

According to the present invention, the second metal layer is formed first and then the barrier layer is formed on the side walls thereof, unlike the prior art where the barrier layer is formed first and then the second metal layer is formed thereon. Thus, there is no need to select materials for the barrier layer which not only achieve the barrier function but also are beneficial for depositing the second metal layer thereon. As a result, the materials for the barrier layer can be selected from more candidates according to the process or design requirements. Specifically, in the prior art, the barrier layer usually assumes a conductive barrier layer; while in the present invention, the barrier layer may also assume an insulating barrier layer. Then, in the case where the barrier layer assumes an insulating barrier layer, the barrier layer may be formed by means of Chemical Vapor Deposition (CVD), which helps the formation of the barrier layer satisfying the process or design requirements when various patterns in the second metal layer have a small distance therebetween.

DETAILED DESCRIPTION OF PREFERRED EMBODIMENTS

Figure 1:
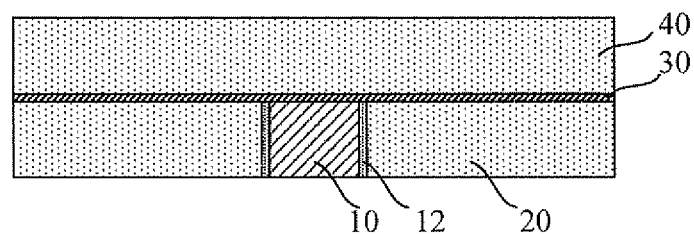
FIGS. 1-6 are schematic structural views showing intermediate structures obtained by respective steps in a flow of forming a metal interconnection structure in the prior art.
Figure 2:
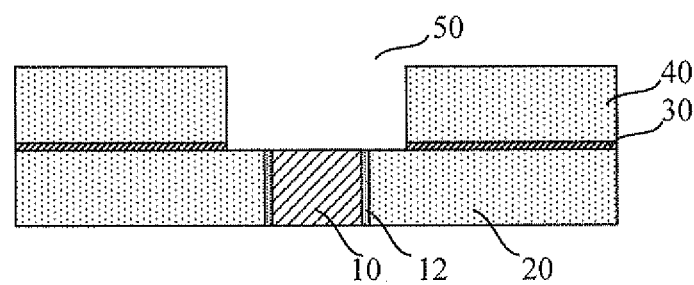
Figure 3:
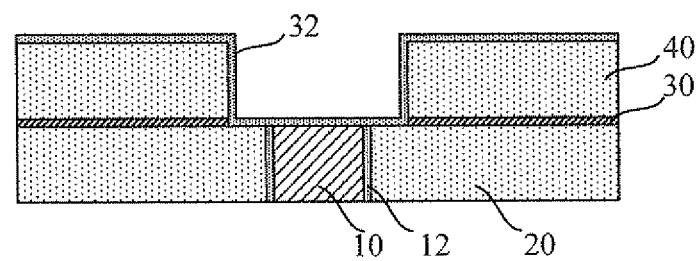
Figure 4:
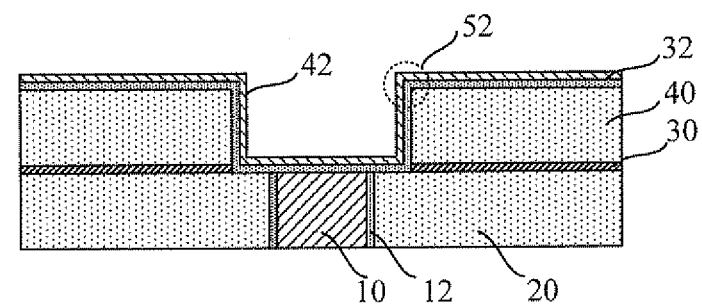
Figure 5:
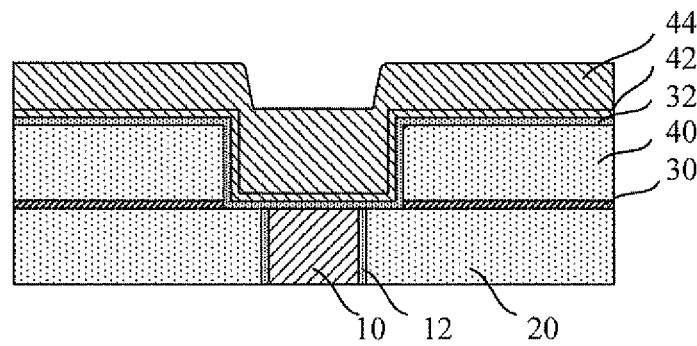
Figure 6:
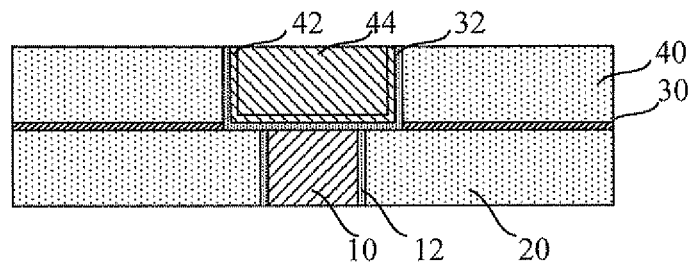

The disclosure hereinafter provides various embodiments or examples to explain the concept of the present invention. Though specific exemplary parts and arrangements are described in the following, they are just examples and not intended to limit the present invention.

Further, in this disclosure same reference numerals and/or symbols may be repeated through different embodiments. Such repeating is for the purpose of simplification and clarity, and does not indicate relationships between the various embodiments and/or arrangements discussed here.

In this disclosure, examples for various specific processes and/or materials are provided. However, substitution of other processes and/or other materials which are apparent for those skilled in the art does not depart from the scope of the present invention. It is to be noted that boundaries of various regions described in this disclosure include necessary extensions required by the processes.

According to the present invention, there is provided a method for forming a metal interlayer via comprising the following steps.

Figure 7:
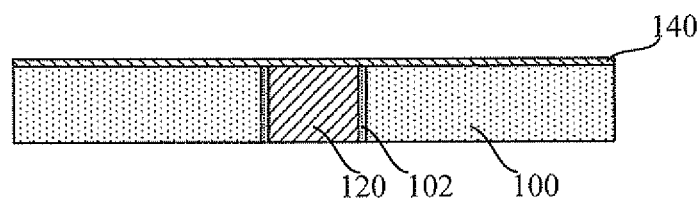
FIG. 7 is a schematic structural view showing a structure where a seed layer has been formed in a flow of forming a metal interlayer via according to an embodiment of the present invention.

First, as shown in FIG. 7, on a first dielectric layer 100 and a first metal layer 120 which is embedded in the first dielectric layer 100, a seed layer 140 is formed.

The first metal layer 120 may be a metal gate, a contact plug and/or a metal interconnection line (in this disclosure, the contact plug refers to a metal filler in a contact hole which directly abuts against a device contact region and is formed in a planar inter-layer dielectric layer that is formed adjacent to the device, and a via refers to a through hole in respective interlayer dielectric layers which is filled up and does not directly abut against the device contact region). The metal gate may comprise a stack of a work function metal layer (such as one of TiN, TiAlN, TaN, TaAlN and TaC, or any combination thereof) and a metal layer (such as one of Ti, Co, Ni, Al and W, or any combination thereof). The contact plug abuts against the contact region via a diffusion barrier layer (such as TiN and/or Ti). The contact plug may be formed of a tungsten layer. In other embodiments, the contact plug may be formed of a tungsten layer and a copper layer formed thereon. The via and the metal interconnection line each may be formed of a copper layer. A barrier layer 102 (such as TaN and/or Ta) is sandwiched between the first dielectric layer 100 and the first metal layer 120.

The seed layer 140 may be formed by means of Physical Vapor Deposition (PVD), such as sputtering or evaporating. The seed layer 140 is used to provide seeds for subsequently growing a second metal layer. In this embodiment, the seed layer 140 may be formed of a copper layer. The seed layer 140 is formed on the surface defined by the first dielectric layer 100 and the first metal layer 120, with no need to form the seed layer on any side walls. Thus, it is possible to avoid the filling difficulty due to the poor coverage of the seed layer on side walls of the contact hole (or a through hole; hereinafter, descriptions directed to the contact hole are also applicable to through holes) and the neck blocking effect as described above, and thus to help reduce the possibility that voids occur in forming the second metal layer in the contact hole. In other embodiments, the seed layer 140 may be formed of one of rubidium (Rb), cobalt (Co), aluminum (Al) and copper (Cu) alloy, or any combination thereof.

Figure 8:
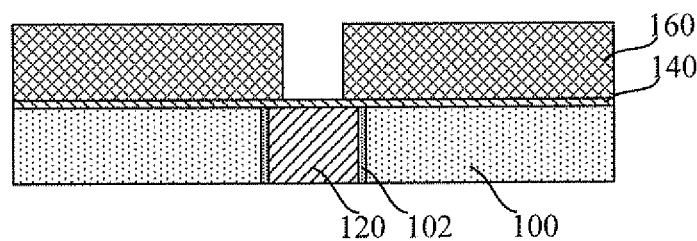
FIGS. 8-13 are schematic views showing intermediate structures obtained by respective steps in a flow of forming a metal interlayer via according to an embodiment of the present invention.

Then, as shown in FIG. 8, a mask pattern 160 is formed on the seed layer 140 to expose a portion of the seed layer 140. The exposed portion of the seed layer 140 covers some of the first metal layer 120.

The mask may be an etching resist layer such as photoresist, or a hard mask such as a silicon oxide layer or a stack of silicon oxide and silicon nitride. In the case where the mask is an etching resist layer, the mask pattern may be formed by means of the exposure and developing process. Alternatively, in the case where the mask is a hard mask, the mask pattern 160 may be formed by: first forming a hard mask layer on the seed layer 140 and a patterned etching resist layer on the hard mask, then forming the mask pattern in the hard mask layer by using the patterned etching resist layer as a mask, and finally removing the patterned etching resist layer.

Figure 9:
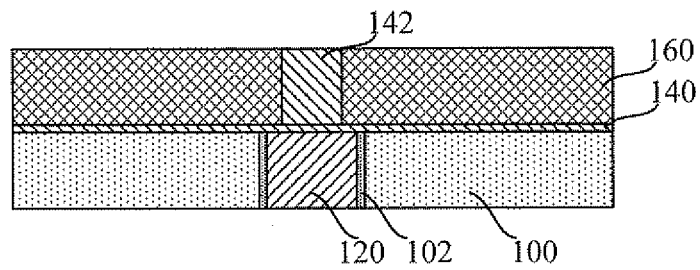

Subsequently, as shown in FIG. 9, a second metal layer 142 is grown on the exposed portion of the seed layer 140. In this embodiment, the second metal layer 142 is formed of a copper layer. The second metal layer 142 may be grown by the plating process. Next, the second metal layer 142 is planarized to expose the mask pattern 160. The planarization may be performed by means of Chemical Mechanical Polishing (CMP).

Figure 10:
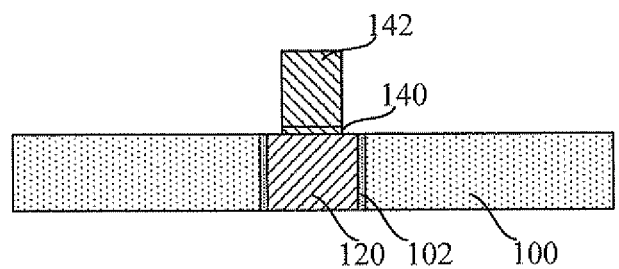

Then, as shown in FIG. 10, the mask pattern 160 and a portion of the seed layer 140 carrying the mask pattern 160 are removed to expose side walls of the second metal layer 142, a portion of the first metal layer 120, and the first dielectric layer 100. In the case where the mask is an etching resist layer, the mask pattern 160 may be removed by means of ashing. Alternatively, in the case where the mask is a hard mask, the mask pattern 160 may be removed by means of Reactive Ion Etching (RIE). The portion of the seed layer 140 may be removed by means of RIE.

Thus, the second metal layer 142 is formed on the first metal layer 120. A second dielectric layer may be formed on the second metal layer 142, and then planarized to expose the second metal layer 142. A further seed layer 140 may be formed on the second metal layer 142 and the second dielectric layer, followed by the subsequent processes, resulting in a metal interconnection.

Here, before the second dielectric layer is formed, it is necessary to first form an insulating barrier layer on the side walls of the second metal layer 142, the portion of the first metal layer and the first dielectric layer, so as to prevent materials of the first metal layer 120 and the second metal layer 142 from diffusing into the dielectric layer.

Figure 11:
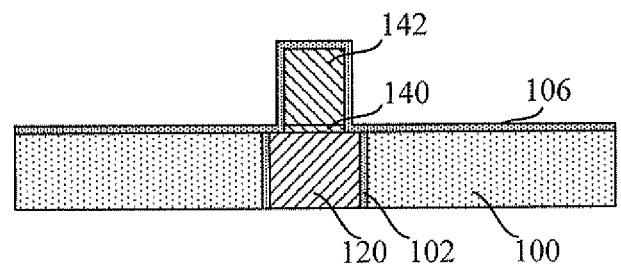
Figure 12:
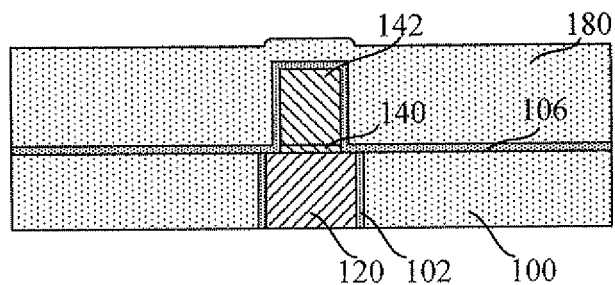
Figure 13:
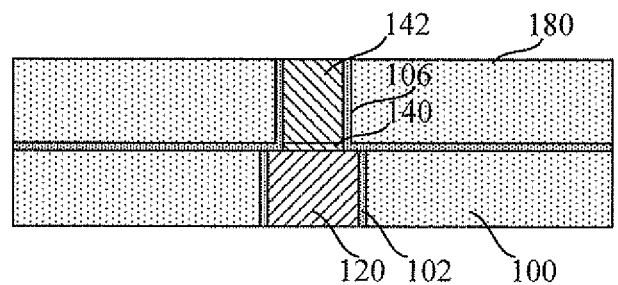

Further, the material of the insulating barrier layer may comprise one of $SiO_2$, SiON, SiO, SiCO, SiCON, SiOF and SiCOH, or any combination thereof. Specifically, the insulating barrier layer 106 may be formed as follows. First, as shown in FIG. 11, the insulating barrier layer 106 is formed to cover the top and the side walls of the second metal layer 142, the portion of the first layer and the first dielectric layer 100. Next, as shown in FIG. 12, a second dielectric layer 180 is formed on the insulating barrier layer 106. Then, as shown in FIG. 13, the second dielectric layer 180 is planarized to expose the top side of the second metal layer 142, wherein the planarization may be performed by means of CMP. In the case where the barrier layer assumes the insulating barrier layer, the barrier layer may be formed by means of CVD, which helps the formation of the barrier layer satisfying the process or design requirements when various patterns in the second metal layer have a small distance therebetween.

The insulating barrier layer, the first dielectric layer and the second dielectric layer each may be formed by means of CVD, PVD, Pulsed Laser Deposition (PLD), Atom Layer Deposition (ALD), Plasma Enhanced Atom Layer Deposition (PEALD), or other suitable processes.

According to the present invention, there is also provided a method for forming a metal interconnection line comprising the following steps.

Figure 14:
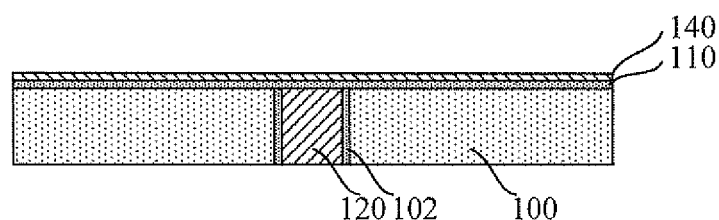
FIG. 14 is a schematic structural view showing a structure where a seed layer has been formed in a flow of forming a metal interconnection line according to an embodiment of the present invention.

First, as shown in FIG. 14, on a first dielectric layer 100 and a first metal layer 120 which is embedded in the first dielectric layer 100, a conductive barrier layer 110 and a seed layer 140 are formed.

The first metal layer 120 may be a contact plug and/or a via. The contact plug abuts against a contact region via a diffusion barrier layer (such as TiN and/or Ti), and may be formed of a tungsten layer. In other embodiments, the contact plug may be formed of a tungsten layer and a copper layer formed thereon. The via may be formed of a copper layer. A barrier layer 102 (such as a conductive barrier layer or an insulating barrier layer) is sandwiched between the first dielectric layer 100 and the first metal layer 120. The conductive barrier layer 110 may be formed by means of PVD.

The seed layer 140 may be formed by means of PVD, such as sputtering or evaporating. The seed layer 140 is used to provide seeds for subsequently growing a second metal layer. In this embodiment, the seed layer 140 may be formed of a copper layer. The seed layer 140 is formed on the surface defined by the first dielectric layer 100 and the first metal layer 120. The seed layer 140 may contact the exposed portion of the first metal layer 120 in an area as large as possible, resulting in enhanced contact effect and reduced contact resistance. In other embodiments, the seed layer 140 may be formed of one of rubidium (Rb), cobalt (Co), aluminum (Al) and copper (Cu) alloy, or any combination thereof.

Figure 15:
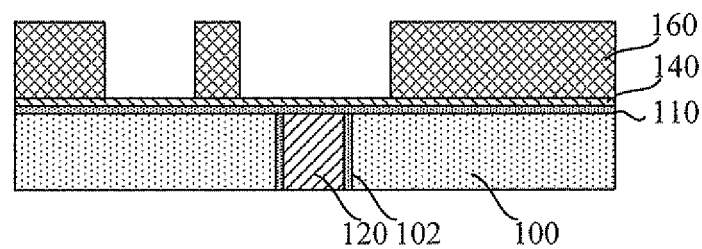
FIGS. 15-22 are schematic views showing intermediate structures obtained by respective steps in a flow of forming a metal interconnection line according to an embodiment of the present invention.

Then, as shown in FIG. 15, a mask pattern 160 is formed on the seed layer 140 to expose a portion of the seed layer 140. The exposed portion of the seed layer 140 covers at least the first metal layer 120.

The mask may be an etching resist layer such as photoresist, or a hard mask such as a silicon oxide layer or a stack of silicon oxide and silicon nitride. In the case where the mask is an etching resist layer, the mask pattern may be formed by means of the exposure and developing process. Alternatively, in the case where the mask is a hard mask, the mask pattern 160 may be formed by: first forming a hard mask layer and a patterned etching resist layer on the seed layer 140, then forming the mask pattern in the hard mask layer by using the patterned etching resist layer as a mask, and finally removing the patterned etching resist layer.

Figure 16:
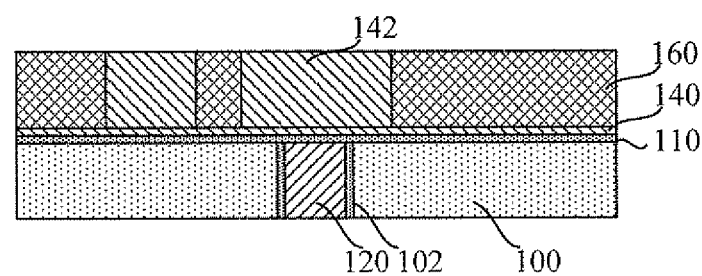

Subsequently, as shown in FIG. 16, a second metal layer 142 is grown on the exposed portion of the seed layer 140. In this embodiment, the second metal layer 142 is formed of a copper layer. The second metal layer 142 may be grown by the plating process. Next, the second metal layer 142 is planarized to expose the mask pattern 160. The planarization may be performed by means of Chemical Mechanical Polishing (CMP).

Figure 17:
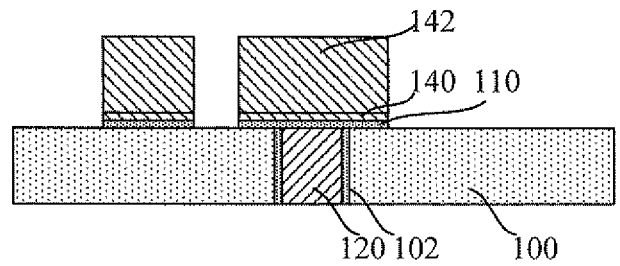

Then, as shown in FIG. 17, the mask pattern 160, and a portion of the conductive barrier layer 110 and a portion of the seed layer 140 carrying the mask pattern 160 are removed to expose side walls of the second metal layer 142 and the first dielectric layer 100. In the case where the mask is an etching resist layer, the mask pattern 160 may be removed by means of ashing. Alternatively, in the case where the mask is a hard mask, the mask pattern 160 may be removed by means of Reactive Ion Etching (RIE). The portion of the seed layer 140 and the portion of the conductive barrier layer 110 may be removed by means of RIE.

Thus, the second metal layer 142 is formed on the first metal layer 120 and the first dielectric layer 100. A second dielectric layer may be formed on the second metal layer 142, and then planarized to expose the second metal layer 142. A further seed layer 140 may be formed on the second metal layer 142 and the second dielectric layer, followed by the subsequent processes, resulting in a metal interconnection.

Figure 18:
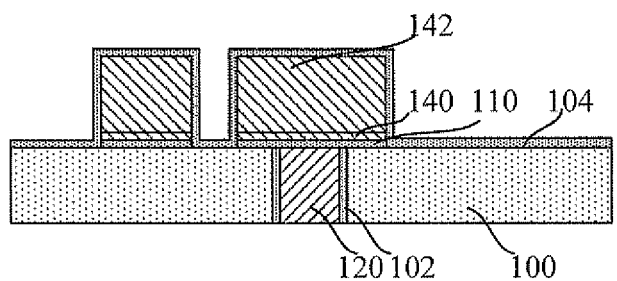
Figure 19:
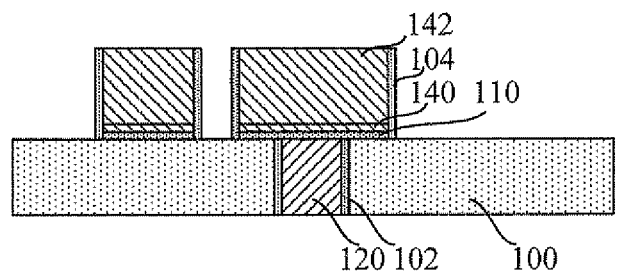

Here, before the second dielectric layer is formed, it is necessary to first form a barrier layer on the side walls of the second metal layer 142, so as to prevent the material of the second metal layer 142 from diffusing into the dielectric layer. Specifically, the barrier layer 104 may be formed as follows. First, as shown in FIG. 18, the barrier layer 104 is deposited on the top and the side walls of the second metal layer 142 and on the first dielectric layer 100. Next, as shown in FIG. 19, portions of the barrier layer 104 covering the top of the second metal layer 142 and the first dielectric layer 100 are removed. The removing may be performed by means of RIE.

In this case, since the barrier layer 104 is formed posterior to the second metal layer 142, which is contrary to the prior art where the barrier layer 104 is formed before the second metal layer 142 is formed thereon, there is no need to select materials for the barrier layer 104 which not only achieve the barrier function but also are beneficial for depositing the second metal layer 142 thereon. As a result, the materials for the barrier layer 104 can be selected from more candidates according to the process or design requirements. In this embodiment, the material of the barrier layer 104 may comprise one of Ta and TaN, or any combination thereof, or may comprise one of $SiO_2$, SiON, SiO, SiCO, SiCON, SiOF and SiCOH, or any combination thereof.

Figure 20:
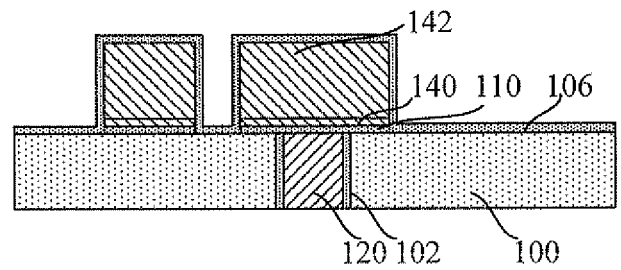
Figure 21:
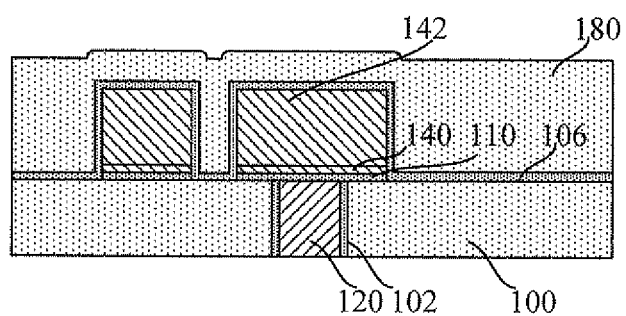
Figure 22:
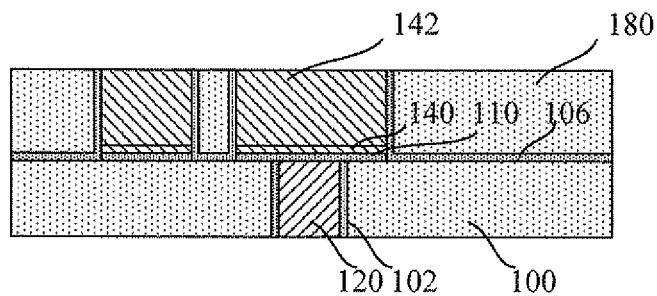

Further, in the case where the barrier layer 104 comprises one of $SiO_2$, SiON, SiO, SiCO, SiCON, SiOF and SiCOH, or any combination thereof, the barrier layer 104 may be formed as follows. First, as shown in FIG. 20, an insulating barrier layer 106 is formed to cover the top and side walls of the second metal layer 142 and the first dielectric layer 100. Next, as shown in FIG. 21, a second dielectric layer 180 is formed on the insulating barrier layer 106. Then, as shown in FIG. 22, the second dielectric layer 180 is planarized to expose the top side of the second metal layer 142, wherein the planarization may be performed by means of CMP. Thus, the insulating barrier layer is formed on the side walls and the first dielectric layer.

The conductive barrier layer, the insulating barrier layer, the first dielectric layer and the second dielectric layer each may be formed by means of CVD, PVD, Pulsed Laser Deposition (PLD), Atom Layer Deposition (ALD), Plasma Enhanced Atom Layer Deposition (PEALD), or other suitable processes.

According to the present invention, there is further provided a metal interconnection structure abutting against a metal gate and a contact region of a device, comprising a contact plug, a via and a metal interconnection line, wherein the contact plug abuts against the contact region via a diffusion barrier layer, and the via is formed on the metal interconnection line, the metal gate and/or the contact plug.

The metal gate may comprise a stack of a work function metal layer (such as one of TiN, TiAlN, TaN, TaAlN and TaC, or any combination thereof) and a metal layer (such as one of Ti, Co, Ni, Al and W, or any combination thereof). The contact plug abuts against the contact region (which may be formed of metal silicide) via the diffusion barrier layer, and may be formed of a tungsten layer. In other embodiments, the contact plug may be formed of a tungsten layer and a copper layer formed thereon. The material of the diffusion barrier layer may be one of Ti and TiN, or any combination thereof.

The side walls of the via and the metal interconnection line, and also an other portion of the top side of the metal interconnection line than a portion thereof abutting against the via may have the insulating barrier layer formed thereon. The material for the insulating barrier layer may comprise one of $SiO_2$, SiON, SiO, SiCO, SiCON, SiOF and SiCOH, or any combination thereof. The bottom side of the metal interconnection line has a conductive barrier layer formed thereon. The material for the conductive barrier layer may comprise one of Ta and TaN, or any combination thereof.

Further, the scope of the present invention is not limited to the processes, structures, manufactures, physical constitutions, means, methods and steps enumerated in the specific embodiments described in the specification. It is apparent for those skilled in the art from the disclosure herein that processes, mechanisms, manufactures, physical constitutions, means, methods or steps, which are in existence now or will be developed in the future, may be applied according to the teachings of the present invention without departing from the scope of the present invention if they perform the substantially same functions as the corresponding embodiments described herein or achieve the substantially same effects.

What is claimed is:

1. A method for forming a metal interlayer via, comprising:
    forming a seed layer on a first dielectric layer and a first metal layer embedded in the first dielectric layer;
    forming a mask pattern on the seed layer to expose a portion of the seed layer covering some of the first metal layer;
    growing a second metal layer on the exposed portion of the seed layer;
    removing the mask pattern and a portion of the seed layer carrying the mask pattern to expose side walls of the second metal layer, a portion of the first metal layer and the first dielectric layer;
    forming an insulating barrier layer on the side walls, the portion of the first metal layer and the first dielectric layer.

2. The method according to claim 1, wherein the step of forming the mask pattern comprises:
    forming a hard mask layer and a patterned etching resist layer on the seed layer;
    forming the mask pattern in the hard mask layer by using the patterned etching resist layer as a mask;
    removing the patterned etching resist layer.

3. The method according to claim 1, wherein the step of forming the insulating barrier layer comprises:
    covering top and side walls of the second metal layer, the portion of the first metal layer and the first dielectric layer with an insulating barrier layer;
    forming a second dielectric layer on the insulating barrier layer;
    planarizing the second dielectric layer to expose the top side of the second metal layer.

4. The method according to claim 1, wherein the material for the insulating barrier layer comprises one of $SiO_2$, SiON, SiO, SiCO, SiCON, SiOF and SiCOH, or any combination thereof.

5. The method according to claim 1, wherein the material for the first metal layer comprises Cu, W or any material for a metal gate, and wherein the material for the seed layer and the material for the second metal layer both comprise Cu.

6. The method according to claim 1, wherein the seed layer is formed by Physical Vapor Deposition.

7. The method according to claim 1, wherein the second metal layer is formed by plating.

8. A method for forming a metal interconnection line, comprising:
    forming a conductive barrier layer and a seed layer on a first dielectric layer and a first metal layer embedded in the first dielectric layer;
    forming a mask pattern on the seed layer to expose a portion of the seed layer covering at least the first metal layer;
    growing a second metal layer on the exposed portion of the seed layer;
    removing the mask pattern and also a portion of the conductive barrier layer and a portion of the seed layer carrying the mask pattern to expose side walls of the second metal layer and the first dielectric layer;
    forming a barrier layer only on the side walls.

9. The method according to claim 8, wherein the step of forming the mask pattern comprises:
    forming a hard mask layer and a patterned etching resist layer on the seed layer;
    forming the mask pattern in the hard mask layer by using the patterned etching resist layer as a mask;
    removing the patterned etching resist layer.

10. The method according to claim 8, wherein the material for the conductive barrier layer comprises one of Ta and TaN, or any combination thereof.

11. The method according to claim 8, wherein the step of forming the barrier layer comprises:
    performing deposition to cover top and side walls of the second metal layer and also the first dielectric layer with a barrier layer;
    performing etching to removing a portion of the barrier layer covering the top wall of the second metal layer and the first dielectric layer.

12. The method according to claim 8, wherein the material for the barrier layer comprises one of Ta and TaN, or any combination thereof, or comprises one of $SiO_2$, SiON, SiO, SiCO, SiCON, SiOF and SiCOH, or any combination thereof.

13. The method according to claim 8, wherein the material for the first metal layer comprises Cu or W, and wherein the material for the seed layer and the material for the second metal layer both comprise Cu.

14. The method according to claim 8, wherein the seed layer is formed by Physical Vapor Deposition.

15. The method according to claim 8, wherein the second metal layer is formed by plating.

16. A method for forming a metal interconnection line, comprising:
    forming a conductive barrier layer and a seed layer on a first dielectric layer and a first metal layer embedded in the first dielectric layer;
    forming a mask pattern on the seed layer to expose a portion of the seed layer covering at least the first metal layer;
    growing a second metal layer on the exposed portion of the seed layer;
    removing the mask pattern and also a portion of the conductive barrier layer and a portion of the seed layer carrying the mask pattern to expose side walls of the second metal layer and the first dielectric layer;
    forming an insulating barrier layer on the side walls and on the first dielectric layer.

17. The method according to claim 16, wherein the step of forming the mask pattern comprises:
    forming a hard mask layer and a patterned etching resist layer on the seed layer;
    forming the mask pattern in the hard mask layer by using the patterned etching resist layer as a mask;
    removing the patterned etching resist layer.

18. The method according to claim 16, wherein the material for the conductive barrier layer comprises one of Ta and TaN, or any combination thereof.

19. The method according to claim 16, wherein the step of forming the insulating barrier layer comprises:
    covering top and side walls of the second metal layer and also the first dielectric layer with an insulating barrier layer;
    forming a second dielectric layer on the insulating barrier layer;
    planarizing the second dielectric layer to expose the top wall of the second metal layer.

20. The method according to claim 16, wherein the material for the insulating barrier layer comprises one of $SiO_2$, SiON, SiO, SiCO, SiCON, SiOF and SiCOH, or any combination thereof.

21. The method according to claim 16, wherein the material for the first metal layer comprises Cu or W, and wherein the material for the seed layer and the material for the second metal layer both comprise Cu.

22. The method according to claim 16, wherein the seed layer is formed by Physical Vapor Deposition.

23. The method according to claim 16, wherein the second metal layer is formed by plating.

* * * * *

UNITED STATES PATENT AND TRADEMARK OFFICE
CERTIFICATE OF CORRECTION

| | | |
|---|---|---|
| PATENT NO. | : 8,575,019 B2 | Page 1 of 1 |
| APPLICATION NO. | : 13/143507 | |
| DATED | : November 5, 2013 | |
| INVENTOR(S) | : Chao Zhao | |

It is certified that error appears in the above-identified patent and that said Letters Patent is hereby corrected as shown below:

In the Specification

Col. 3, line 64
  Delete "on the portion of" – before "in the mold"

Signed and Sealed this
Fourth Day of February, 2014

Michelle K. Lee
*Deputy Director of the United States Patent and Trademark Office*